United States Patent
Ohashi

(10) Patent No.: US 8,294,506 B2
(45) Date of Patent: Oct. 23, 2012

(54) DRIVING SYSTEM FOR SWITCHING POWER SUPPLY TO REDUCE SWITCH NOISE AND SWITCHING LOSS

(75) Inventor: Hidetomo Ohashi, Matsumoto (JP)

(73) Assignee: Fuji Electric Co., Ltd., Kawasaki-Shi (JP)

( * ) Notice: Subject to any disclaimer, the term of this patent is extended or adjusted under 35 U.S.C. 154(b) by 963 days.

(21) Appl. No.: 12/289,545

(22) Filed: Oct. 30, 2008

(65) Prior Publication Data

US 2009/0116267 A1    May 7, 2009

(30) Foreign Application Priority Data

Nov. 1, 2007    (JP) ................................. 2007-285015

(51) Int. Cl.
*G05F 1/607*    (2006.01)
*G05F 1/61*    (2006.01)

(52) U.S. Cl. ...................... 327/365; 323/224; 323/225

(58) Field of Classification Search ................. 323/224, 323/268, 271, 273, 274, 282, 284, 225; 327/365, 327/376, 377, 379, 380, 381, 382, 391, 403
See application file for complete search history.

(56) References Cited

U.S. PATENT DOCUMENTS

| 5,424,665 A * | 6/1995 | Sueri et al. .................... 327/108 |
| 2002/0080634 A1 | 6/2002 | Nozawa | |

FOREIGN PATENT DOCUMENTS

| JP | 2001-327165 | 11/2001 |
| JP | 2002-125366 | 4/2002 |

* cited by examiner

*Primary Examiner* — Gary L Laxton
*Assistant Examiner* — Nusrat Quddus
(74) *Attorney, Agent, or Firm* — Manabu Kanesaka

(57) ABSTRACT

A driving system for an electrical power conversion equipment includes a driving circuit for driving a switching device provided in the electrical power conversion equipment, and a driving capacity control circuit for controlling a driving capacity of the driving circuit. The driving capacity during a resonant operation of the electrical power conversion equipment becomes higher than that at a start of the resonant operation when the switching device is turned-on.

9 Claims, 10 Drawing Sheets

WAVEFORM AT DRIVING SIGNAL INPUT TERMINAL (S1)

WAVEFORM AT SWITCHING DEVICE DRIVING TERMINAL (S2)

WAVEFORM AT TRIGGER SIGNAL INPUT TERMINAL (S3)

WAVEFORM OF Vds OF SWITCHING DEVICE

WAVEFORM OF Id OF SWITCHING DEVICE

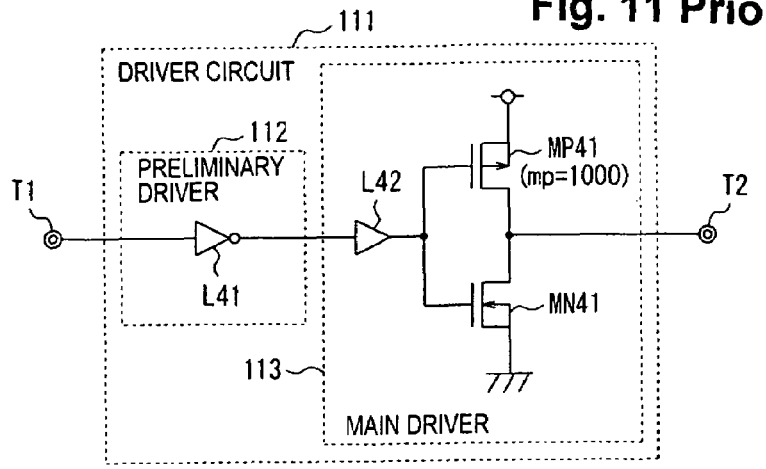
Fig. 11 Prior Art
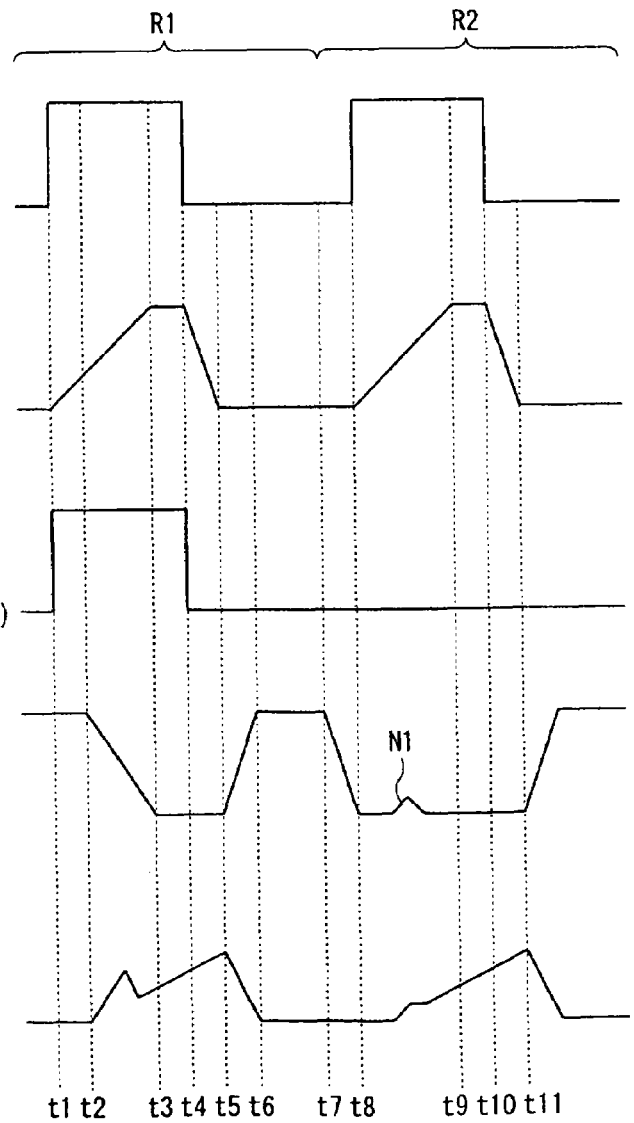
Fig. 12(a) Prior Art
WAVEFORM AT DRIVING SIGNAL INPUT TERMINAL (S1)
Fig. 12(b) Prior Art
WAVEFORM AT SWITCHING DEVICE DRIVING TERMINAL (S2)
Fig. 12(c) Prior Art
WAVEFORM AT TRIGGER SIGNAL INPUT TERMINAL (S3)
Fig. 12(d) Prior Art
WAVEFORM OF Vds OF SWITCHING DEVICE
Fig. 12(e) Prior Art
WAVEFORM OF Id OF SWITCHING DEVICE

WAVEFORM AT DRIVING SIGNAL INPUT TERMINAL (S1)

WAVEFORM AT SWITCHING DEVICE DRIVING TERMINAL (S2)

WAVEFORM AT TRIGGER SIGNAL INPUT TERMINAL (S3)

WAVEFORM OF Vds OF SWITCHING DEVICE

WAVEFORM OF Id OF SWITCHING DEVICE

DRIVING SYSTEM FOR SWITCHING POWER SUPPLY TO REDUCE SWITCH NOISE AND SWITCHING LOSS

BACKGROUND OF THE INVENTION AND RELATED ART STATEMENT

The present invention relates to a driving system for an electrical power conversion equipment, and in particular, it is preferably applied to a driving system of a switching device at the start of or during a resonant operation in a resonance or pseudo resonance source in an electric power conversion equipment.

There are a switching power supply and an inverter etc., which use a resonance operation or a pseudo resonance operation for an electrical power conversion equipment. In a certain driving system for a switching power supply for example, switching control is carried out while performing a resonant operation or a pseudo resonant operation to reduce the loss of a switching device. Namely, in the resonant operation, the state in which the current or the voltage of the switching device becomes zero is intermittently brought about. When the current or the voltage of the switching device becomes zero, the switching device is made turned-on or turned-off, by which the loss of the switching device can be made zero. In the pseudo resonant operation, when the current or the voltage of the switching device becomes zero, the switching device is made turned-on, by which the loss at the turning-on of the switching device can be made zero (Patent Document 1: Japanese Unexamined patent Application Publication No. JP-A-2002-209381 (corresponding to U.S. Pat. No. 6,483,722)).

FIG. 10 is a block diagram schematically showing the configuration of a switching power supply for performing a resonant operation.

In FIG. 10, the switching power supply is provided with switching devices Q1, Q2, which are connected in series with each other. Along with this, to the switching device Q1, an LC series resonance circuit formed of a capacitor C and a reactor L is connected in parallel. For each of the switching devices Q1, Q2, there can be used an insulated gate power device such as an IGBT (Insulated Gate Bipolar Transistor) or a power MOSFET, for example.

The gates of the switching devices Q1, Q2 are connected to a driving control section 3 through driver circuits 5, 4, respectively. Here, to the driving control section 3, an input detecting section 1 is connected which detects whether the drain current Id or the drain voltage Vds of the switching device Q1 is zero or not. Along with this, a trigger outputting section 2 is also connected which outputs a trigger signal S3 making the resonant operation of the LC series resonance circuit start.

Moreover, the trigger signal S3 outputted from the trigger outputting section 2 makes the switching device Q1 turned-on, which starts up the switching power supply. At this time, the switching device Q2 remains turned-off. This makes a current flow in the LC series resonance circuit through the switching device Q1, by which the LC series resonance circuit starts a resonant operation.

Upon the resonant operation of the LC series resonance circuit, the input detecting section 1 detects the drain current Id and the drain voltage Vds, and outputs the detected results to the driving control section 3. Then, the driving control section 3 detects a timing at which the drain current Id or the drain voltage Vds becomes zero to make the switching device Q1 turned-on and turned-off, by which the driving control section 3 can carry out switching control of the switching device Q1 while making the loss of the switching device Q1.

FIG. 11 is a block diagram schematically showing an example of the configuration of a related driving system for a switching power supply.

In FIG. 11, a driver circuit 111 is provided with a preliminary driver 112 and a main driver 113. The driver circuit 111 can be used as the driver circuit 5 shown in FIG. 10.

The preliminary driver 112 is provided with a logic inverting circuit L41. Along with this, the main driver 113 is provided with a buffer L42, a p-channel transistor MP41 and an n-channel transistor MN41. The p-channel transistor MP41 is formed of a plurality of p-channel unit transistors connected in parallel and the number mp thereof can be taken as, for example, 1000. The p-channel transistor MP41 and the n-channel transistor MN41 are connected in series. To the gates of the p-channel transistor MP41 and the n-channel transistor MN41, the output terminal of the logic inverting circuit L41 is connected through the buffer L42. Moreover, the input terminal of the logic inverting circuit L41 is connected to a driving signal input terminal T1 and the connection point of the p-channel transistor MP41 and the n-channel transistor MN41 is further connected to a switching device driving terminal T2.

FIG. 12 is a diagram showing waveforms of signals in various sections of the driving system of the switching power supply shown in FIG. 11.

In FIG. 12, at the start of the resonant operation R1, the trigger signal S3 is outputted from the trigger outputting section 2 shown in FIG. 10 to change the level of the trigger signal S3 from a low level to a high level (t1). The trigger signal S3 outputted from the trigger outputting section 2 makes a driving signal S1 outputted from the driving control section 3 to the driver circuit 111 to change the level of the electric potential at the driving signal input terminal T1 from a low level to a high level. Then, the change in the level of the electric potential at the driving signal input terminal T1 from the low level to the high level makes the change in the level of the electric potential transmitted to the gates of the p-channel transistor MP41 and the n-channel transistor MN41 through the logic inverting circuit L41 and the buffer L42 to turn-on the p-channel transistor MP41 and, along with this, to turn-off the n-channel transistor MN41. This makes the level of the electric potential at the switching device driving terminal T2 gradually shift from a low level to a high level according to the driving capacity of the p-channel transistor MP41 (t1 to t3).

The gradual shift of the level of the electric potential at the switching device driving terminal T2 from the low level to the high level gradually shifts the level of the drain voltage Vds of the switching device Q1 shown in FIG. 10 from a high level to a low level (t2 to t3) and, along with this, gradually increases the drain current Id of the switching device Q1 (t2 to t5).

Next to this, the change in the level of the trigger signal S3 from the high level to the low level (t4) changes the level of the electric potential at the driving signal input terminal T1 from the high level to the low level. Then, the change in the level of the electric potential at the driving signal input terminal T1 from the high level to the low level makes the change in the electric potential transmitted to the gates of the p-channel transistor MP41 and the n-channel transistor MN41 through the logic inverting circuit L41 and the buffer L42 to turn-off the p-channel transistor MP41 and, along with this, to turn-on the n-channel transistor MN41. This makes the level of the electric potential at the switching device driving terminal T2 shift from the high level to the low level (t4 to t5).

The shift of the level of the electric potential at the switching device driving terminal T2 from the high level to the low level shifts the level of the drain voltage Vds of the switching device Q1 shown in FIG. 10 from the low level to the high level (t5 to t6) and, along with this, decreases the drain current Id of the switching device Q1 (t5 to t6).

Following this, during a resonant operation R2, by the resonant operation of the LC series resonance circuit, the level of the drain voltage Vds of the switching device Q1 shifts from the high level to the low level (t7 to t8). The drain voltage Vds of the switching device Q1 is detected by the input detecting section 1 and the detected signal is outputted to the driving control section 3. Then, at a timing at which the level of the drain current Id or the drain voltage Vds of the switching device Q1 becomes zero, the driving signal S1 is outputted from the driving control section 3 to the driver circuit 111 to change the level of the electric potential at the driving signal input terminal T1 from the low level to the high level (t8).

The change in the level of the electric potential at the driving signal input terminal T1 from the low level to the high level makes the change in the level of the electric potential transmitted to the gates of the p-channel transistor MP41 and the n-channel transistor MN41 through the logic inverting circuit L41 and the buffer L42 to turn-on the p-channel transistor MP41 and, along with this, to turn-off the n-channel transistor MN41. This makes the level of the electric potential at the switching device driving terminal T2 gradually shift from the low level to the high level according to the driving capacity of the p-channel transistor MP41 (t8 to t9).

The gradual shift of the level of the electric potential at the switching device driving terminal T2 from the low level to the high level gradually increases the drain current Id of the switching device Q1 (t8 to t11). Here, when the p-channel transistor MP41 has a low driving capacity to prolong the duration until the level of the electric potential at the switching device driving terminal T2 shifts from the low level to the high level, a switching is carried out when the drain voltage Vds of the switching device Q1 is not zero to increase a switching loss N1.

Subsequent to this, the change in the level of the electric potential at the driving signal input terminal T1 from the high level to the low level (t10) makes the change in the level of the electric potential transmitted to the gates of the p-channel transistor MP41 and the n-channel transistor MN41 through the logic inverting circuit L41 and the buffer L42 to turn-off the p-channel transistor MP41 and, along with this, to turn-on the n-channel transistor MN41. This makes the level of the electric potential at the switching device driving terminal T2 shift from the high level to the low level (t10 to t11).

Then, the shift of the level of the electric potential at the switching device driving terminal T2 from the high level to the low level shifts the level of the drain voltage Vds of the switching device Q1 shown in FIG. 10 from the low level to the high level (t11) and, along with this, decreases the drain current Id of the switching device Q1 (t11).

FIG. 13 is a block diagram schematically showing another example of the configuration of a related driving system for a switching power supply.

In FIG. 13, a driver circuit 121 is provided with a preliminary driver 122 and a main driver 123. The driver circuit 121 can be used as the driver circuit 5 shown in FIG. 10.

The preliminary driver 122 is provided with a logic inverting circuit L43. Along with this, the main driver 123 is provided with a buffer L44, a p-channel transistor MP42 and an n-channel transistor MN42. The p-channel transistor MP42 is formed of a plurality of p-channel unit transistors connected in parallel and the number mp thereof can be taken as, for example, 4000. The p-channel transistor MP42 and the n-channel transistor MN42 are connected in series. To the gates of the p-channel transistor MP42 and the n-channel transistor MN42, the output terminal of the logic inverting circuit L43 is connected through the buffer L44. Moreover, the input terminal of the logic inverting circuit L43 is connected to a driving signal input terminal T1 and the connection point of the p-channel transistor MP42 and the n-channel transistor MN42 is further connected to a switching device driving terminal T2.

FIG. 14 is a diagram showing waveforms of signals in various sections of the driving system of the switching power supply shown in FIG. 13.

In FIG. 14, at the start of the resonant operation R1, the trigger signal S3 is outputted from the trigger outputting section 2 shown in FIG. 10 to change the level of the trigger signal S3 from a low level to a high level (t1). The trigger signal S3 outputted from the trigger outputting section 2 makes the driving signal S1 outputted from the driving control section 3 to the driver circuit 121 to change the level of the electric potential at the driving signal input terminal T1 from a low level to a high level. Then, the change in the level of the electric potential at the driving signal input terminal T1 from the low level to the high level makes the change in the level of the electric potential transmitted to the gates of the p-channel transistor MP42 and the n-channel transistor MN42 through the logic inverting circuit L43 and the buffer L44 to turn-on the p-channel transistor MP42 and, along with this, to turn-off the n-channel transistor MN42. This makes the level of the electric potential at the switching device driving terminal T2 gradually shift from a low level to a high level according to the driving capacity of the p-channel transistor MP42 (t1 to t3).

The gradual shift of the level of the electric potential at the switching device driving terminal T2 from the low level to the high level gradually shifts the drain voltage Vds of the switching device Q1 shown in FIG. 10 from a high level to a low level (t2 to t3) and, along with this, gradually increases the drain current Id of the switching device Q1 (t2 to t5). Here, when the p-channel transistor MP42 has a high driving capacity to shorten the duration until the level of the electric potential at the switching device driving terminal T2 shifts from the low level to the high level, a peak in the drain current Id of the switching device Q1 becomes large thereby increasing a switching noise N2.

Next, the change in the level of the trigger signal S3 from the high level to the low level (t4) changes the level of the electric potential at the driving signal input terminal T1 from the high level to the low level. Then, the change in the level of the electric potential at the driving signal input terminal T1 from the high level to the low level makes the change in the electric potential transmitted to the gates of the p-channel transistor MP42 and the n-channel transistor MN42 through the logic inverting circuit L43 and the buffer L44 to turn-off the p-channel transistor MP42 and, along with this, to turn-on the n-channel transistor MN42. This makes the level of the electric potential at the switching device driving terminal T2 shift from the high level to the low level (t4 to t5).

The shift of the level of the electric potential at the switching device driving terminal T2 from the high level to the low level shifts the level of the drain voltage Vds of the switching device Q1 shown in FIG. 10 from the low level to the high level (t5 to t6) and, along with this, it decreases the drain current Id of the switching device Q1 (t5 to t6).

Following this, during a resonant operation R2, by the resonant operation of the LC series resonance circuit, the level of the drain voltage Vds of the switching device Q1 shifts from the high level to the low level (t7 to t8). The drain voltage Vds of the switching device Q1 is detected by the input detecting section 1 and the detected signal is outputted to the driving control section 3. Then, at a timing at which the level of the drain current Id or the drain voltage Vds of the switching device Q1 becomes zero, the driving signal S1 is outputted from the driving control section 3 to the driver circuit 121 to change the level of the electric potential at the driving signal input terminal T1 from the low level to the high level (t8).

The change in the level of the electric potential at the driving signal input terminal T1 from the low level to the high level makes the change in the level of the electric potential transmitted to the gates of the p-channel transistor MP42 and the n-channel transistor MN42 through the logic inverting circuit L43 and the buffer L44 to turn-on the p-channel transistor MP42 and, along with this, to turn-off the n-channel transistor MN42. This makes the level of the electric potential at the switching device driving terminal T2 gradually shift from the low level to the high level according to the driving capacity of the p-channel transistor MP42 (t8 to t9).

The gradual shift of the level of the electric potential at the switching device driving terminal T2 from the low level to the high level gradually increases the drain current Id of the switching device Q1 (t8 to t11).

Subsequently, the change in the level of the electric potential at the driving signal input terminal T1 from the high level to the low level (t10) makes the change in the level of the electric potential transmitted to the gates of the p-channel transistor MP42 and the n-channel transistor MN42 through the logic inverting circuit L43 and the buffer L44 to turn-off the p-channel transistor MP42 and, along with this, to turn-on the n-channel transistor MN42. This makes the level of the electric potential at the switching device driving terminal T2 shift from the high level to the low level (t10 to t11).

Then, the shift of the level of the electric potential at the switching device driving terminal T2 from the high level to the low level shifts the level of the drain voltage Vds of the switching device Q1 shown in FIG. 10 from the low level to the high level (t11) and, along with this, decreases the drain current Id of the switching device Q1 (t11).

However, in the related driving system for a switching power supply, as shown in FIG. 11, the lowered driving capacity of the p-channel transistor MP41, although it can reduce the switching noise N2 at the start of the resonant operation R1, increases the switching loss N1 at the resonant operation R2.

While, as shown in FIG. 13, the enhanced driving capacity of the p-channel transistor MP42 reduces the switching loss N1 at the resonant operation R2, it increases the switching noise N2 at the start of the resonant operation.

This causes a problem in the related driving system for a switching power supply in that neither the switching noise N2 at the start of the resonant operation R1 nor the switching loss N1 at the resonant operation can be reduced.

Accordingly, it is an object of the invention to provide a driving system for a switching power supply which can reduce both of the switching noise at the start of the resonant operation and the switching loss N1 at the resonant operation.

Further objects and advantages of the invention will be apparent from the following description of the invention.

SUMMARY OF THE INVENTION

For solving the above problem, a driving system for an electrical power conversion equipment according to a first aspect of the invention is a system including a driving circuit driving a switching device provided in an electrical power conversion equipment, and a driving capacity control circuit controlling the driving capacity of the driving circuit when the switching device is turned-on so that the driving capacity during a resonant operation of the electrical power conversion equipment becomes higher than that at the start of the resonant operation.

According to a second aspect of the invention, the driving circuit includes a main driver driving the switching device connected on the output side thereof at the start of the resonant operation and at the resonant operation by a signal inputted on the controlling input side thereof, and a sub-driver connected in parallel to the main driver. The sub-driver is controlled by the driving capacity control circuit so as to be operated at the resonant operation and made to stop the operation thereof at the start of the resonant operation.

According to a third aspect of the invention, the driving circuit is provided with a current mirror circuit driving the switching device by a current mirror operation.

According to a fourth aspect of the invention, the driving circuit includes a main driver driving the switching device connected on the output side thereof at the start of the resonant operation and at the resonant operation by a signal inputted on the controlling input side thereof, and a sub-driver provided with a capacitor connected in parallel to the output side of the main driver. The sub-driver is controlled by the driving capacity control circuit so as to disconnect the capacitor from the output side of the main driver at the resonant operation and to connect the capacitor to the output side of the main driver at the start of the resonant operation.

According to a fifth aspect of the invention, the driving circuit includes a main driver driving the switching device connected on the output side thereof at the start of the resonant operation and during the resonant operation by a signal inputted on the controlling input side thereof, and a sub-driver provided with a capacitor connected in parallel to the controlling input side of the main driver. The sub-driver is controlled by the driving capacity control circuit so as to disconnect the capacitor from the controlling input side of the main driver at the resonant operation and to connect the capacitor to the controlling input side of the main driver at the start of the resonant operation.

According to a sixth aspect of the invention, the driving circuit includes a main driver driving the switching device connected on the output side thereof at the start of the resonant operation and at the resonant operation by a signal inputted on the controlling input side thereof, and a sub-driver provided with a resistor connected in series to the output side of the main driver. The sub-driver is controlled by the driving capacity control circuit so as to short-circuit the resistor at the resonant operation and to release the capacitor from being short-circuited at the start of the resonant operation.

According to a seventh aspect of the invention, the driving circuit includes a main driver driving the switching device connected on the output side thereof at the start of the resonant operation and at the resonant operation by a signal inputted on the controlling input side thereof, and a sub-driver switching the voltage on the controlling input side of the main driver. The sub-driver is controlled by the driving capacity control circuit so as to switch the voltage on the controlling input side of the main driver for making the voltage at the resonant operation of the electrical power conversion equipment become higher than that at the start of the resonant operation.

According to an eighth aspect of the invention, the driving circuit includes a main driver driving the switching device connected on the output side thereof at the start of the resonant operation and at the resonant operation by a signal inputted on the controlling input side thereof, and a sub-driver switching the voltage on the output side of the main driver. The sub-driver is controlled by the driving capacity control circuit so as to switch the voltage on the output side of the main driver for making the voltage at the resonant operation of the electrical power conversion equipment become higher than that at the start of the resonant operation.

As is explained in the foregoing, according to the invention, the driving capacity of the driving circuit when the switching device is made turned-on is controlled so that the driving capacity becomes higher at the resonant operation than at the start of the resonant operation. This makes it possible to reduce both of the switching noise at the start of the resonant operation and the switching loss at the resonant operation thereby enabling both of noise reduction at the start of the resonant operation and low power consumption at the resonant operation.

BRIEF DESCRIPTION OF THE DRAWINGS

FIG. 11 is a block diagram schematically showing an example of the configuration of a conventional driving system for a switching power supply;

FIG. 12 is a diagram showing waveforms of signals in various sections of the driving system of the switching power supply shown in FIG. 11;

DETAILED DESCRIPTION OF THE PREFERRED EMBODIMENTS

In the following, explanations will be made about driving systems for switching power supplies according to the embodiments of the invention with reference to the drawings.

Figure 1:
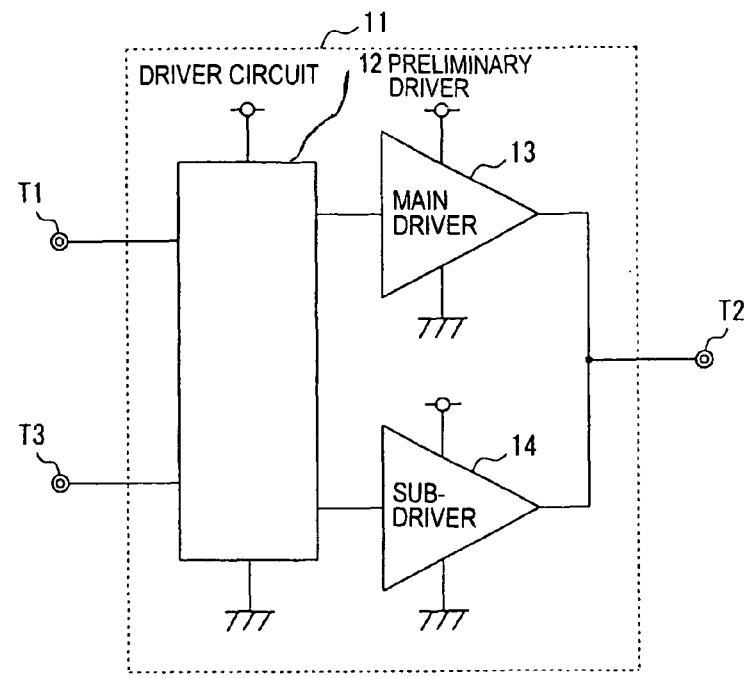
FIG. 1 is a block diagram schematically showing a configuration of a driving system for a switching power supply according to a first embodiment of the invention.

FIG. 1 is a block diagram schematically showing the configuration of the driving system for a switching power supply according to a first embodiment of the invention.

In FIG. 1, a driver circuit 11 is provided with a preliminary driver 12, a main driver 13 and a sub-driver 14. The driver circuit 11 can be used as the driver circuit 5 shown in FIG. 10.

Figure 10:
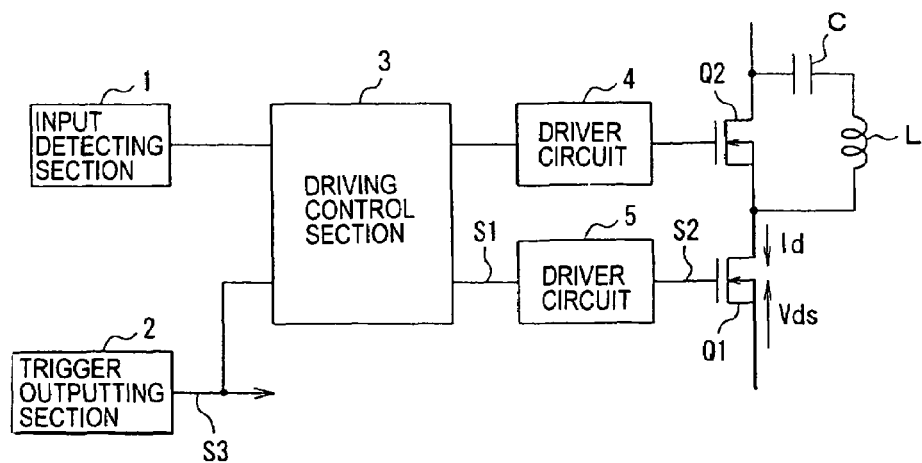
FIG. 10 is a block diagram schematically showing the configuration of a switching power supply for a resonant operation.

The main driver 13 and the sub-driver 14 driving the switching device Q1 shown in FIG. 10 are connected in parallel and the connection point of the main driver 13 and the sub-driver 14 is connected to a switching device driving terminal T2. Moreover, a driving signal input terminal T1 inputting a driving signal S1 and a trigger signal input terminal T3 inputting a trigger signal S3 are connected to the preliminary driver 12. In addition, the preliminary driver 12 can control the driving capacity of the driver circuit 11 when making the switching device Q1 turned-on so that the driving capacity during a resonant operation of the switching power supply shown in FIG. 10 becomes higher than that at the start of the resonant operation thereof.

The driving signal S1 and the trigger signal S3 inputted to the preliminary driver 12 bring the preliminary driver 12 to operate the main driver 13 while making the operation of the sub-driver 14 stop. This makes the switching device Q1 turned-on to start the resonant operation of the switching power supply shown in FIG. 10. Then, the driving signal S1 inputted to the preliminary driver 12 with the resonant operation of the switching power supply shown in FIG. 10 being made started makes the preliminary driver 12 operate both of the main driver 13 and the sub driver 14 to turn-on the switching device Q1, which allows the switching power supply shown in FIG. 10 to continue the resonant operation thereof.

This can control the driving capacity of the driver circuit 11 when making the switching device Q1 turned-on so that the driving capacity during a resonant operation of the switching power supply shown in FIG. 10 becomes higher than that at the start of the resonant operation thereof. Thus, it is possible to reduce both of the switching noise at the start of the resonant operation and the switching loss at the resonant operation, which enables both of noise reduction at the start of the resonant operation and low power consumption at the resonant operation.

Figure 2:
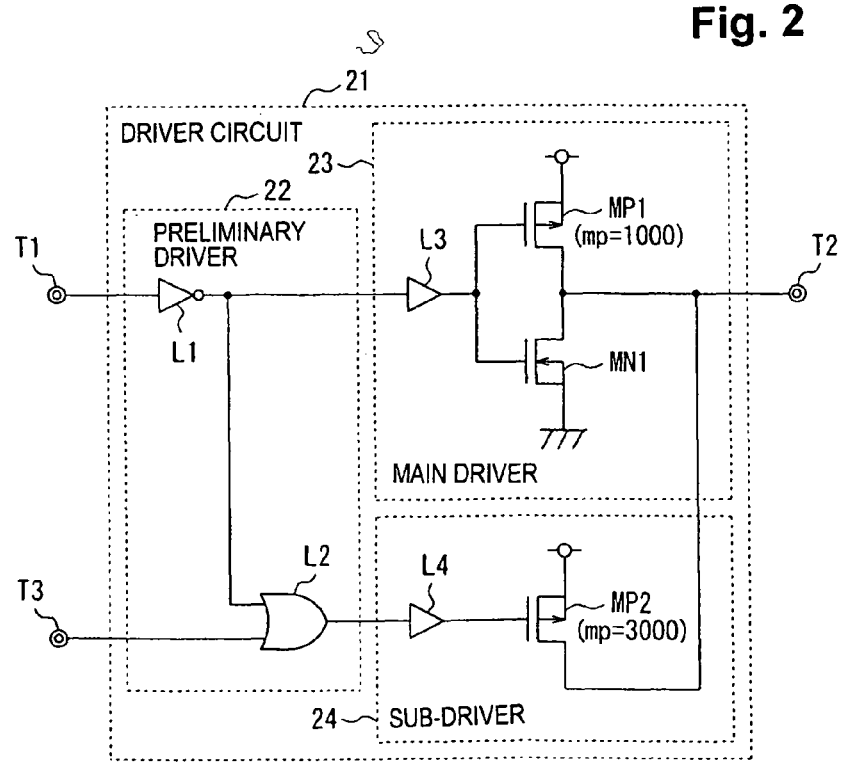
FIG. 2 is a block diagram schematically showing a configuration of a driving system for a switching power supply according to a second embodiment of the invention.
Figure 3A:
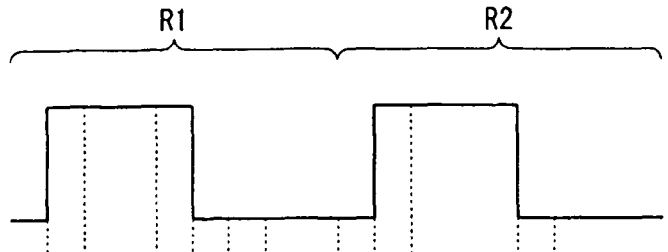
FIGS. 3(a) to 3(e) are diagrams showing waveforms of signals in various sections of the driving system of the switching power supply shown in FIG. 2.
Figure 3B:
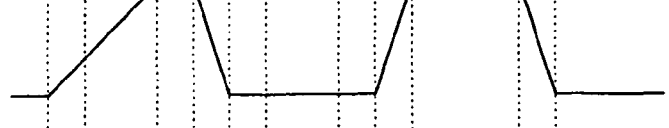
Figure 3C:
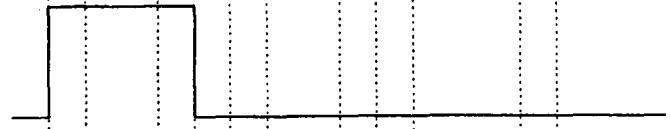
Figure 3D:
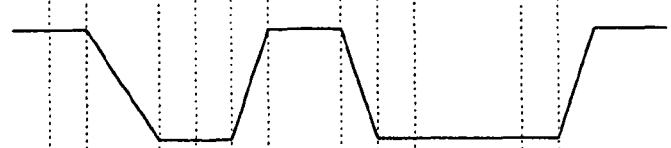
Figure 3E:
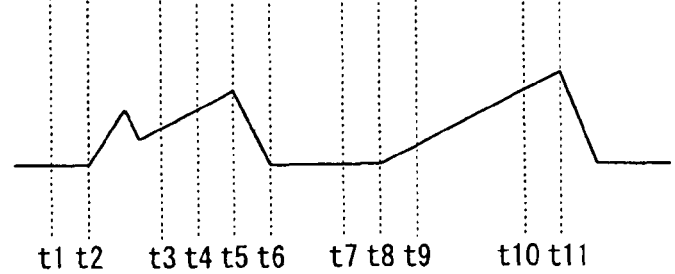

FIG. 2 is a block diagram schematically showing the configuration of the driving system for a switching power supply according to a second embodiment of the invention.

In FIG. 2, a driver circuit 21 is provided with a preliminary driver 22, a main driver 23 and a sub-driver 24. The driver circuit 21 can be used as the driver circuit 5 shown in FIG. 10.

The preliminary driver 22 is provided with a logic inverting circuit L1 and a logical sum circuit L2. Along with this, the main driver 23 is provided with a buffer L3, a p-channel transistor MP1 and an n-channel transistor MN1. Moreover, the sub-driver 24 is provided with a buffer L4 and a p-channel transistor MP2.

The p-channel transistor MP1 is formed of a plurality of p-channel unit transistors connected in parallel and the number mp thereof can be taken as, for example, 1000. The p-channel transistor MP2 is formed of a plurality of p-channel unit transistors connected in parallel and the number mp thereof can be taken as, for example, 3000. The p-channel transistor MP1 and the n-channel transistor MN1 are connected in series. Along with this, to the p-channel transistor MP1, the p-channel transistor MP2 is connected in parallel. To the gates of the p-channel transistor MP1 and the n-channel transistor MN1, the output terminal of the logic inverting circuit L1 is connected through the buffer L3.

Moreover, the input terminal of the logic inverting circuit L1 is connected to a driving signal input terminal T1 and the connection point of the p-channel transistor MP1 and the n-channel transistor MN1 is further connected to a switching device driving terminal T2. In addition, one of the input terminals of the logical sum circuit L2 is connected to the output terminal of the logic inverting circuit L1, the other input terminal of the logical sum circuit L2 is connected to a trigger signal input terminal T3 and the output terminal of the logical sum circuit L2 is connected to the gate of the p-channel transistor MP2 through the buffer L4.

FIG. 3 is a diagram showing waveforms of signals in various sections of the driving system of the switching power supply shown in FIG. 2.

In FIGS. 3(a) to 3(e), at the start of the resonant operation R1, a trigger signal S3 is outputted from the trigger outputting section 2 shown in FIG. 10 to change the level of the trigger signal S3 from a low level to a high level (t1). The trigger signal S3 outputted from the trigger outputting section 2 makes a driving signal S1 outputted from the driving control section 3 to the driver circuit 21 to change the level of the electric potential at the driving signal input terminal T1 from a low level to a high level. Then, the change in the level of the electric potential at the driving signal input terminal T1 from the low level to the high level makes the change in the level of the electric potential transmitted to the gates of the p-channel transistor MP1 and the n-channel transistor MN1 through the logic inverting circuit L1 and the buffer L3 to turn-on the p-channel transistor MP1 and, along with this, to turn-off the n-channel transistor MN1.

Moreover, the change in the level of the trigger signal S3 from the low level to the high level changes the level of the electric potential at the trigger signal input terminal T3 from the low level to the high level. Then, the change in the level of the electric potential at the trigger signal input terminal T3 from the low level to the high level changes the level of the electric potential at the output terminal of the logical sum circuit L2 from the low level to the high level. The change in the level of the electric potential is transmitted to the gate of the p-channel transistor MP2 through the buffer L4 to turn-off the p-channel transistor MP2. This makes the level of the electric potential at the switching device driving terminal T2 gradually shift from a low level to a high level according to the driving capacity of the p-channel transistor MP1 (t1 to t3).

The gradual shift of the level of the electric potential at the switching device driving terminal T2 from the low level to the high level gradually shifts the level of the drain voltage Vds of the switching device Q1 shown in FIG. 10 from a high level to a low level (t2 to t3) and, along with this, the drain current Id of the switching device Q1 is gradually increased (t2 to t5). Here, at the start of the resonant operation R1, by turning-on the p-channel transistor MP1 and, along with this, making the p-channel transistor MP2 turned-off, the driving capacity of the driver circuit 21 can be made low. This can prolong the duration until the level of the electric potential at the switching device driving terminal T2 shifts from the low level to the high level to make it possible to minimize the peak of the drain current Id of the switching device Q1. Thus, the switching noise N2 shown in FIG. 14 can be reduced.

Next, the change in the level of the trigger signal S3 from the high level to the low level (t4) changes the level of the electric potential at the driving signal input terminal T1 from the high level to the low level. Then, the change in the level of the electric potential at the driving signal input terminal T1 from the high level to the low level makes the change in the level of the electric potential transmitted to the gates of the p-channel transistor MP1 and the n-channel transistor MN1 through the logic inverting circuit L1 and the buffer L3 to turn-off the p-channel transistor MP1 and, along with this, to turn-on the n-channel transistor MN1. Moreover, the change in the level of the electric potential at the driving signal input terminal T1 from the high level to the low level keeps the p-channel transistor MP2 turned-off. This makes the level of the electric potential at the switching device driving terminal T2 shift from the high level to the low level (t4 to t5).

The shift of the level of the electric potential at the switching device driving terminal T2 from the high level to the low level shifts the level of the drain voltage Vds of the switching device Q1 shown in FIG. 10 from the low level to the high level (t5 to t6) and, along with this, the drain current Id of the switching device Q1 is decreased (t5 to t6).

Following this, during a resonant operation R2, by the resonant operation of the LC series resonance circuit, the level of the drain voltage Vds of the switching device Q1 shifts from the high level to the low level (t7 to t8). The drain voltage Vds of the switching device Q1 is detected by the input detecting section 1 and the detected signal is outputted to the driving control section 3. Then, at a timing when the level of the drain current Id or the drain voltage Vds of the switching device Q1 becomes zero, the driving signal S1 is outputted from the driving control section 3 to the driver circuit 21 to change the level of the electric potential at the driving signal input terminal T1 from the low level to the high level (t8). Then, the change in the level of the electric potential at the driving signal input terminal T1 from the low level to the high level makes the change in the level of the electric potential transmitted to the gates of the p-channel transistor MP1 and the n-channel transistor MN1 through the logic inverting circuit L1 and the buffer L3 to turn-on the p-channel transistor MP1 and, along with this, to turn-off the n-channel transistor MN1.

The change in the level of the electric potential at the driving signal input terminal T1 from the low level to the high level changes the level of the electric potential at the output terminal of the logical sum circuit L2 from the high level to the low level. The change in the level of the electric potential is transmitted to the gate of the p-channel transistor MP2 through the buffer L4 to turn-on the p-channel transistor MP2. This makes the level of the electric potential at the switching device driving terminal T2 gradually shift from the low level to the high level according to the driving capacities of the p-channel transistors MP1 and MP2 (t8 to t9).

The gradual shift of the level of the electric potential at the switching device driving terminal T2 from the low level to the high level gradually increases the drain current Id of the switching device Q1 (t8 to t11). Here, at the resonant operation R2, by making both of the p-channel transistors MP1 and MP2 turned-on, the driving capacity of the driver circuit 21 can be enhanced. This can shorten the duration until the level of the electric potential at the switching device driving terminal T2 shifts from the low level to the high level to make it possible to prevent the switching device Q1 from carrying out switching when the drain voltage Vds of the switching device Q1 is not zero. Thus, the switching loss N1 shown in FIG. 12 can be reduced.

Subsequent to this, the change in the level of the electric potential at the driving signal input terminal T1 from the high level to the low level (t10) makes the change in the level of the electric potential transmitted to the gates of the p-channel transistor MP1 and the n-channel transistor MN1 through the logic inverting circuit L1 and the buffer L3 to turn-off the p-channel transistor MP1 and, along with this, to turn-on the n-channel transistor MN1. Moreover, the change in the level of the electric potential at the driving signal input terminal T1 from the high level to the low level makes the p-channel transistor MP2 turned-off. This makes the level of the electric potential at the switching device driving terminal T2 shift from the high level to the low level (t10 to t11).

Then, the shift of the level of the electric potential at the switching device driving terminal T2 from the high level to the low level shifts the level of the drain voltage Vds of the switching device Q1 shown in FIG. 10 from the low level to the high level (t11) and, along with this, the drain current Id of the switching device Q1 (t11) is decreased.

This enables the rising of the electric potential at the switching device driving terminal T2 to slow at the start of the resonant operation R1, and also enables the rising of the electric potential at the switching device driving terminal T2 to abrupt at the resonant operation R2. Thus, it is possible to reduce both of the switching noise N2 at the start of the resonant operation R1 and the switching loss N1 at the resonant operation R2, which enables both of noise reduction at the start of the resonant operation R1 and low power consumption at the resonant operation R2.

Figure 13:
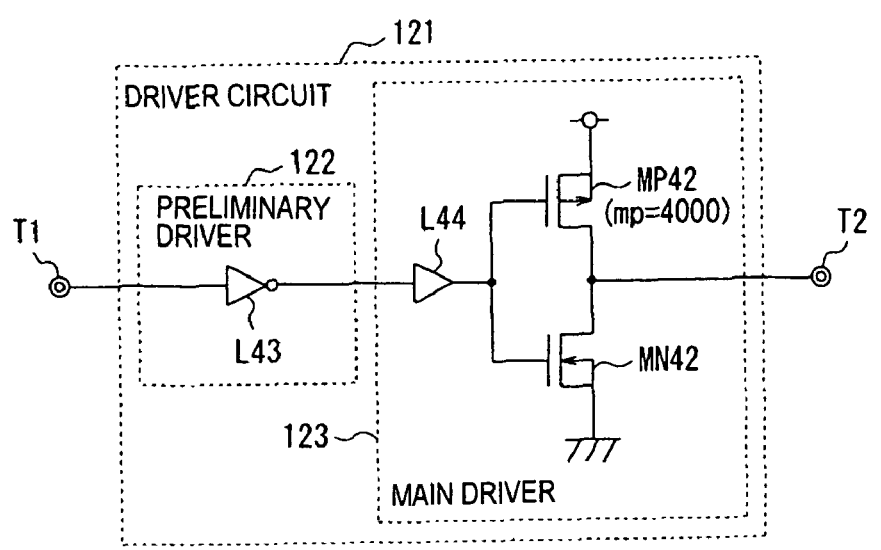
FIG. 13 is a block diagram schematically showing another example of the configuration of a conventional driving system for a switching power supply.
Figure 14A:
FIGS. 14(a)-14(e) are diagrams showing waveforms of signals in various sections of the driving system of the switching power supply shown in FIG. 13.
Figure 14B:
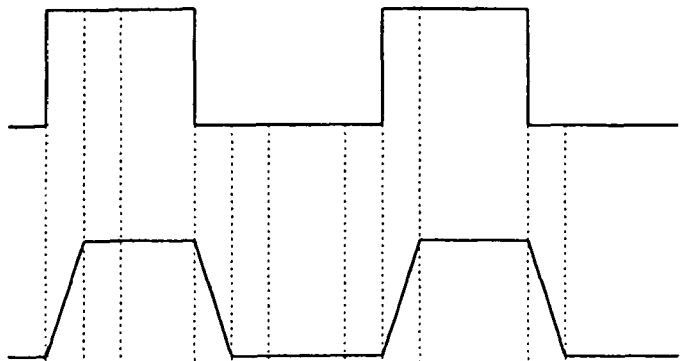
Figure 14C:
Figure 14D:
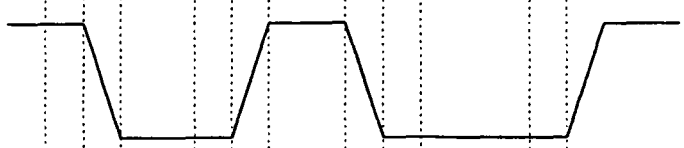
Figure 14E:
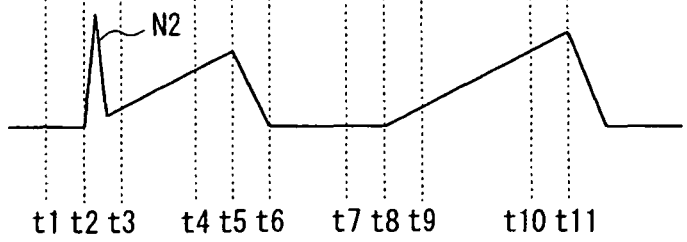

Moreover, the turning-on of both of the p-channel transistors MP1 and MP2 enables the realization of the driver circuit 21 shown in FIG. 2 with an area approximately equivalent to the laying out area of the driver circuit 121 shown in FIG. 13. Therefore, an increase in the laying out area can be suppressed while enabling both of noise reduction at the start of the resonant operation R1 and low power consumption at the resonant operation R2.

Figure 4:
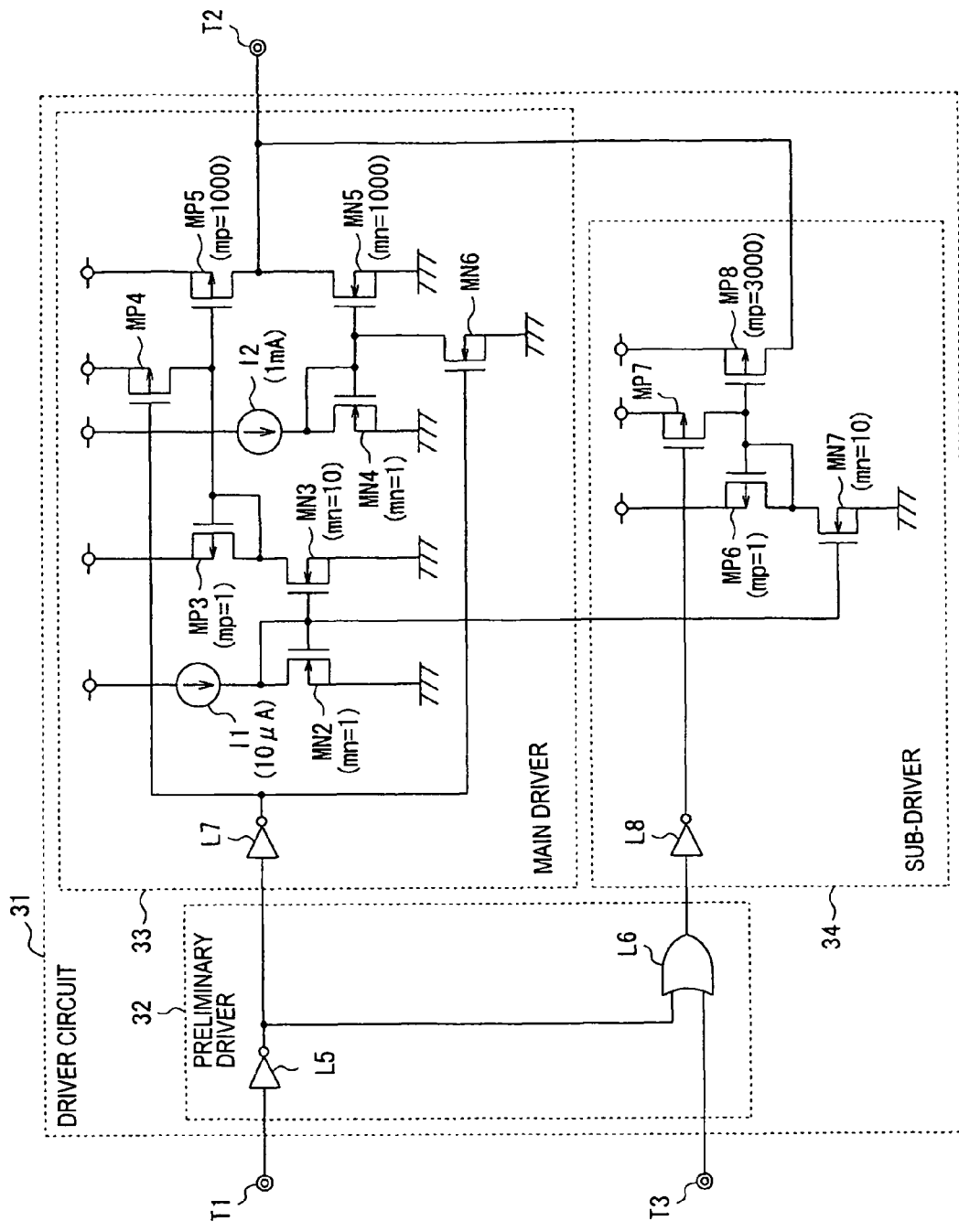
FIG. 4 is a block diagram schematically showing the configuration of the driving system for a switching power supply according to a third embodiment of the invention.

FIG. 4 is a block diagram schematically showing the configuration of the driving system for a switching power supply according to a third embodiment of the invention.

In FIG. 4, a driver circuit 31 is provided with a preliminary driver 32, a main driver 33 and a sub-driver 34. The driver circuit 31 can be used as the driver circuit 5 shown in FIG. 10.

The preliminary driver 32 is provided with a logic inverting circuit L5 and a logical sum circuit L6. Along with this, the main driver 33 is provided with a logic inverting circuit L7, current sources I1 and I2, p-channel transistors MP3 to MP5 and n-channel transistors MN2 to MN6. Moreover, the sub-driver 34 is provided with a logic inverting circuit L8, p-channel transistors MP6 to MP8 and an n-channel transistor MN7.

The number mp of each of the p-channel transistors MP3 and MP6 can be taken as, for example, 1, the p-channel transistor MP5 is made of a plurality of p-channel unit transistors connected in parallel and the number mp thereof can be taken as, for example, 1000, and the p-channel transistor MP8 is made of a plurality of p-channel unit transistors connected in parallel and the number mp thereof can be taken as, for example, 3000. Moreover, the number mn of each of the n-channel transistors MN2 and MN4 can be taken as, for example, 1, each of the n-channel transistor MN3 and MN4 is made of a plurality of p-channel unit transistors connected in parallel and the number mn thereof can be taken as, for example, 10, and the n-channel transistor MN5 is made of a plurality of n-channel unit transistors connected in parallel and the number mn thereof can be taken as, for example, 1000.

The p-channel transistor MP5 and the n-channel transistor MN5 are connected in series. Along with this, to the p-channel transistor MP5, the p-channel transistor MP8 is connected in parallel. Moreover, the n-channel transistors MN2 and MN3 form a current mirror circuit, the n-channel transistors MN4 and MN5 form a current mirror circuit, the p-channel transistors MP3 and MP5 form a current mirror circuit, and the p-channel transistors MP6 and MP8 form a current mirror circuit.

To the drains of the n-channel transistors MN2 and MN4, the current sources I1 and I2 are connected, respectively. Moreover, the gates of the n-channel transistors MN2 and MN3 are connected to the drain of the n-channel transistor MN2, and the gates of the n-channel transistors MN4 and MN5 are connected to the drain of the n-channel transistor MN4.

Furthermore, the gates of the p-channel transistors MP3 and MP5 are connected to the drain of the p-channel transistor MP4, and the gates of the p-channel transistors MP6 and MP8 are connected to the drain of the p-channel transistor MP7 and the drain of the N-channel transistor MN7. In addition, the gates of the n-channel transistors MN4 and MN5 are connected to the drain of the n-channel transistor MN6.

To the gates of the p-channel transistor MP4 and the n-channel transistor MN6, the output terminal of the logic inverting circuit L5 is connected through the logic inverting circuit L7. Moreover, the input terminal of the logic inverting circuit L5 is connected to a driving signal input terminal T1 and the connection point of the p-channel transistor MP5 and the n-channel transistor MN5 is further connected to a switching device driving terminal T2. In addition, one of the input terminals of the logical sum circuit L6 is connected to the output terminal of the logic inverting circuit L5, the other input terminal of the logical sum circuit L6 is connected to a trigger signal input terminal T3, and the output terminal of the logical sum circuit L6 is connected to the gate of the p-channel transistor MP7 through the logic inverting circuit L8.

At the start of the resonant operation, the driving signal S1 and the trigger signal S3 inputted to the driving signal input terminal T1 and the trigger signal input terminal T3, respectively, of the preliminary driver 32 make the p-channel transistors MP5 turned-on and, along with this, make the n-channel transistor MN5 and the p-channel transistor MP8 turned-off while being subjected to current amplification by the n-channel transistors MN2 to MN4 and MN 7 and the p-channel transistors MP3, MP4, MP6 and MP7. The turning-on of the p-channel transistor MP5 and the turning-off of the n-channel transistor MN5 and the p-channel transistor MP8 make the switching device Q1 shown in FIG. 10 turned-on according to the driving capacity of the p-channel transistor MP5 to start the resonant operation of the switching power supply shown in FIG. 10.

At the resonant operation, the driving signal S1 inputted to the driving signal input terminal T1 of the preliminary driver 32 makes the p-channel transistors MP5 and MP8 turned-on and, along with this, makes the n-channel transistor MN5 turned-off while being subjected to current amplification by the n-channel transistors MN2 to MN4 and MN 7 and the p-channel transistors MP3, MP4, MP6 and MP7. The turning-on of the p-channel transistors MP5 and MP8 and the turning-off of the n-channel transistor MN5 make the switching device Q1 shown in FIG. 10 turned-on according to the driving capacities of the p-channel transistors MP5 and MP8 to continue the resonant operation of the switching power supply shown in FIG. 10.

This makes it possible to reduce both of the switching noise N2 at the start of the resonant operation R1 and the switching loss N1 at the resonant operation R2 while amplifying currents inputted to the driver circuit 31. This enables both of noise reduction at the start of the resonant operation R1 and low power consumption at the resonant operation R2 even in the case where a current inputted to the driver circuit 31 is small.

Figure 5:
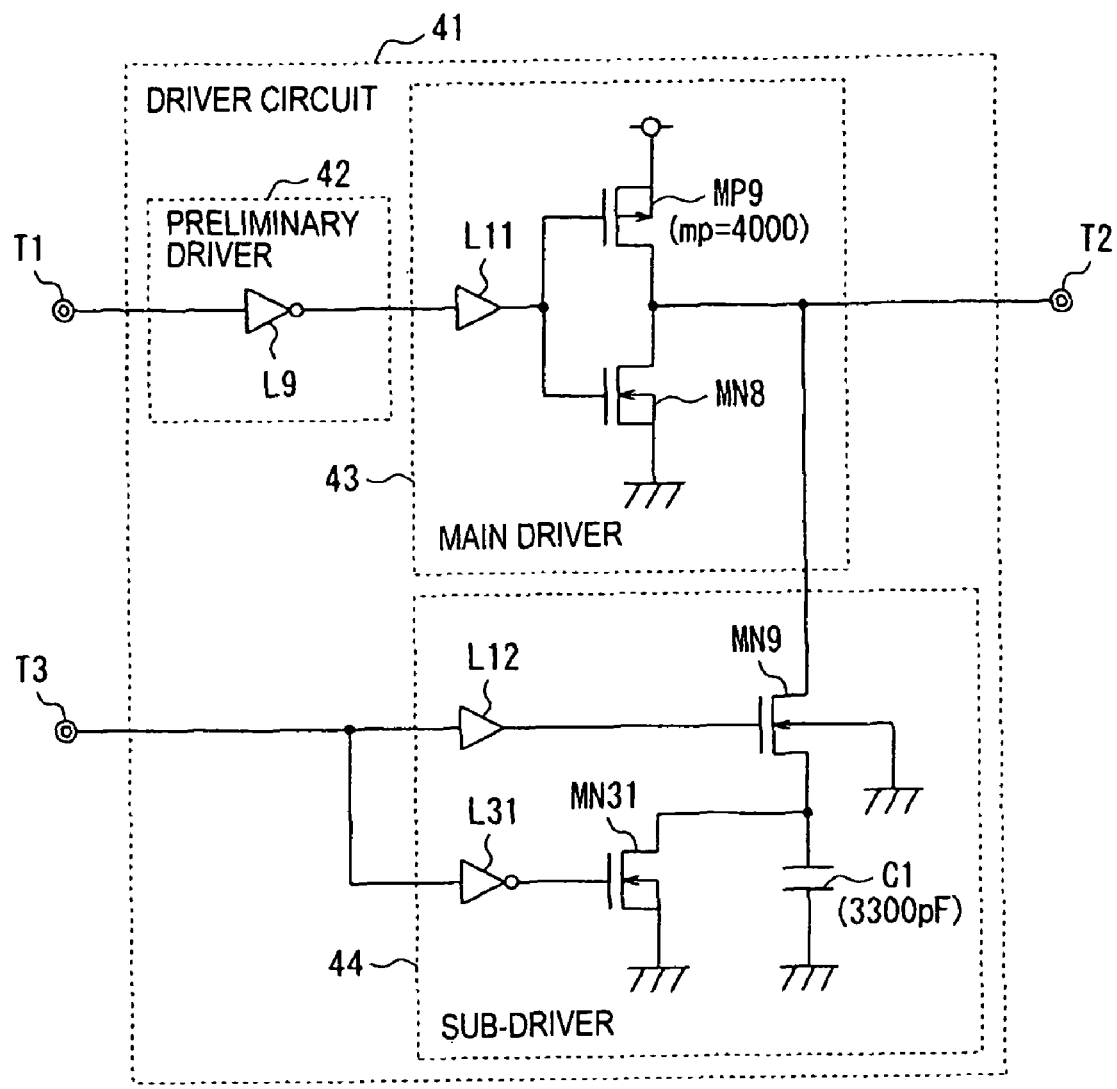
FIG. 5 is a block diagram schematically showing the configuration of the driving system for a switching power supply according to a fourth embodiment of the invention.

FIG. 5 is a block diagram schematically showing the configuration of the driving system for a switching power supply according to a fourth embodiment of the invention.

In FIG. 5, a driver circuit 41 is provided with a preliminary driver 42, a main driver 43 and a sub-driver 44. The driver circuit 41 can be used as the driver circuit 5 shown in FIG. 10.

The preliminary driver 42 is provided with a logic inverting circuit L9. Along with this, the main driver 43 is provided with a buffer L11, a p-channel transistor MP9 and an n-channel transistor MN8. Moreover, the sub-driver 44 is provided with a buffer L12, a logic inverting circuit L31, a capacitor C1 and n-channel transistors MN9 and MN31.

The p-channel transistor MP9 is made of a plurality of p-channel unit transistors connected in parallel, and the number mp thereof can be taken as, for example, 4000. The capacitance of the capacitor C1 can be taken as, for example, 3300 pF.

The p-channel transistor MP9 and the n-channel transistor MN8 are connected in series. Along with this, the capacitor C1 is connected to the n-channel transistor MN8 in parallel through the n-channel transistor MN9. Moreover, the output terminal of the logic inverting circuit L9 is connected through the buffer L11 to the gates of the p-channel transistor MP9 and the n-channel transistor MN8.

Moreover, the input terminal of the logic inverting circuit L9 is connected to a driving signal input terminal T1 and the connection point of the p-channel transistor MP9 and the n-channel transistor MN8 is further connected to a switching device driving terminal T2. In addition, a trigger signal input terminal T3 is connected to the gate of the n-channel transistor MN9 through the buffer L12 and, along with this, to the gate of the n-channel transistor MN31 through the logic inverting circuit L31. The drain of the n-channel transistor MN31 is connected to the connection point of the n-channel transistor MN9 and the capacitor C1.

At the start of the resonant operation, a driving signal S1 inputted to the driving signal input terminal T1 of the preliminary driver 42 makes the p-channel transistor MP9 turned-on and, along with this, makes the n-channel transistor MN8 turned-off. Moreover, a trigger signal S3 inputted to the trigger signal input terminal T3 of the sub-driver 44 changes the level of the electric potential at the trigger signal input terminal T3 from a low level to a high level to turn-on the n-channel transistor MN9, whereby the capacitor C1 is connected to the p-channel transistor MP9 as the load thereof.

Then, the p-channel transistor MP9 which is made turned-on and the n-channel transistor MN8 which is made turned-off along with this with the capacitor C1 being connected to the p-channel transistor MP9 as the load thereof make the switching device Q1 shown in FIG. 10 turned-on according to the driving capacity of the p-channel transistor MP9 to start the resonant operation of the switching power supply shown in FIG. 10 while the capacitor C1 is being driven by the p-channel transistor MP9.

After the trigger signal S3 is inputted, the change in the level of the electric potential at the trigger signal input terminal T3 from a high level to a low level makes the n-channel transistor MN9 turned-off to disconnect the capacitor C1 from the p-channel transistor MP9. Along with this, the n-channel transistor MN31 is made turned-on to discharge the capacitor C1.

Then, at the resonant operation, the driving signal S1 inputted to the driving signal input terminal T1 of the preliminary driver 42 makes the p-channel transistor MP9 turned-on and, along with this, makes the n-channel transistor MN8 turned-off with the capacitor C1 being disconnected from the p-channel transistor MP9. The turning-on of the p-channel transistors MP9 and the turning-off of the n-channel transistor MN5 along with this make the switching device Q1 shown in FIG. 10 turned-on according to the driving capacity of the p-channel transistor MP9 to continue the resonant operation of the switching power supply shown in FIG. 10.

This enables the switching power supply shown in FIG. 10 to make the load of the driver circuit 41 heavier at the start of the resonant operation thereof and to make the load lightened at the resonant operation thereof. Along with this, the sub-driver 44 can be made provided externally. Thus, it becomes possible to reduce both of the switching noise N2 at the start of the resonant operation R1 and the switching loss N1 at the resonant operation R2 while the driver circuit 121 shown in FIG. 13 is being made utilized as it is. This enables both of noise reduction at the start of the resonant operation R1 and low power consumption at the resonant operation R2.

Figure 6:
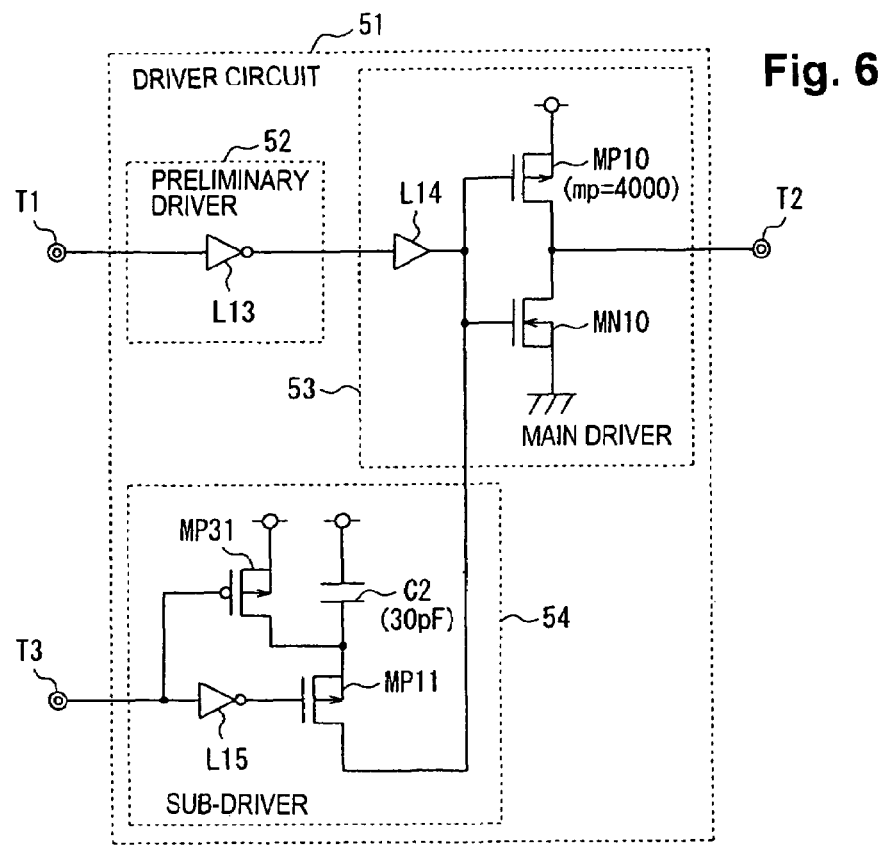
FIG. 6 is a block diagram schematically showing the configuration of the driving system for a switching power supply according to a fifth embodiment of the invention.

FIG. 6 is a block diagram schematically showing the configuration of the driving system for a switching power supply according to a fifth embodiment of the invention.

In FIG. 6, a driver circuit 51 is provided with a preliminary driver 52, a main driver 53 and a sub-driver 54. The driver circuit 51 can be used as the driver circuit 5 shown in FIG. 10.

The preliminary driver 52 is provided with a logic inverting circuit L13. Along with this, the main driver 53 is provided with a buffer L14, a p-channel transistor MP10 and an n-channel transistor MN10. Moreover, the sub-driver 54 is provided with a logic inverting circuit L15, a capacitor C2 and p-channel transistors MP11 and MP31.

The p-channel transistor MP10 is made of a plurality of p-channel unit transistors connected in parallel, and the number mp thereof can be taken as, for example, 4000. The capacitance of the capacitor C1 can be taken as, for example, 30 pF. The p-channel transistor MP10 and the n-channel transistor MN10 are connected in series. Along with this, to the gates of the p-channel transistor MP10 and the n-channel transistor MN10, the capacitor C2 is connected in parallel through the p-channel transistor MP11. Moreover, the output terminal of the logic inverting circuit L13 is connected to the gates of the p-channel transistor MP10 and the n-channel transistor MN10 through the buffer L14.

Moreover, the input terminal of the logic inverting circuit L13 is connected to a driving signal input terminal T1, and the connection point of the p-channel transistor MP10 and the n-channel transistor MN10 is further connected to a switching device driving terminal T2. In addition, a trigger signal input terminal T3 is connected to the gate of the p-channel transistor MP31 and, along with this, to the gate of the p-channel transistor MP11 through the logic inverting circuit L15. The drain of the p-channel transistor MP31 is connected to the connection point of the p-channel transistor MP11 and the capacitor C2.

At the start of the resonant operation, a driving signal S1 inputted to the driving signal input terminal T1 of the preliminary driver 52 makes the p-channel transistor MP10 turned-on and, along with this, makes the n-channel transistor MN10 turned-off. Moreover, a trigger signal S3 inputted to the trigger signal input terminal T3 of the sub-driver 54 changes the level of the electric potential at the trigger signal input terminal T3 from a low level to a high level to turn-on the p-channel transistor MP11. Thereby, the capacitor C2 is connected to the gates of the p-channel transistor MP10 and the n-channel transistor MN10.

Then, the p-channel transistor MP10 which is made turned-on and the n-channel transistor MN10 which is made turned-off along with this with the capacitor C2 being connected to the gates of the p-channel transistor MP10 and the n-channel transistor MN10 make the switching device Q1 shown in FIG. 10 turned-on according to the driving capacity of the p-channel transistor MP10 to start the resonant operation of the switching power supply shown in FIG. 10 while the capacitor C2 is being driven by the preliminary driver 52.

After the trigger signal S3 is inputted, the change in the level of the electric potential at the trigger signal input terminal T3 from a high level to a low level makes the p-channel transistor MP11 turned-off to disconnect the capacitor C2 from the gates of the p-channel transistor MP10 and the n-channel transistor MN10. Along with this, the p-channel transistor MP31 is made turned-on to discharge the capacitor C2.

Then, at the resonant operation, the driving signal S1 inputted to the driving signal input terminal T1 of the preliminary driver 52 makes the p-channel transistor MP10 turned-on and, along with this, makes the n-channel transistor MN10 turned-off with the capacitor C2 being disconnected from the gates of the p-channel transistor MP10 and the n-channel transistor MN10. The turning-on of the p-channel transistors MP10 and the turning-off of the n-channel transistor MN10 along with this make the switching device Q1 shown in FIG. 10 turned-on according to the driving capacity of the p-channel transistor MP10 to continue the resonant operation of the switching power supply shown in FIG. 10.

This enables the switching power supply shown in FIG. 10 to make the load of the driver circuit 52 heavier at the start of the resonant operation thereof and to make the load lightened at the resonant operation thereof. This enables the rising of the electric potential at the switching device driving terminal T2 to slow at the start of the resonant operation R1 and the rising of the electric potential at the switching device driving terminal T2 to be abrupt at the resonant operation R2. Thus, it is possible to reduce both of the switching noise N2 at the start of the resonant operation R1 and the switching loss N1 at the resonant operation R2, which enables both of noise reduction at the start of the resonant operation R1 and low power consumption at the resonant operation R2.

Figure 7:
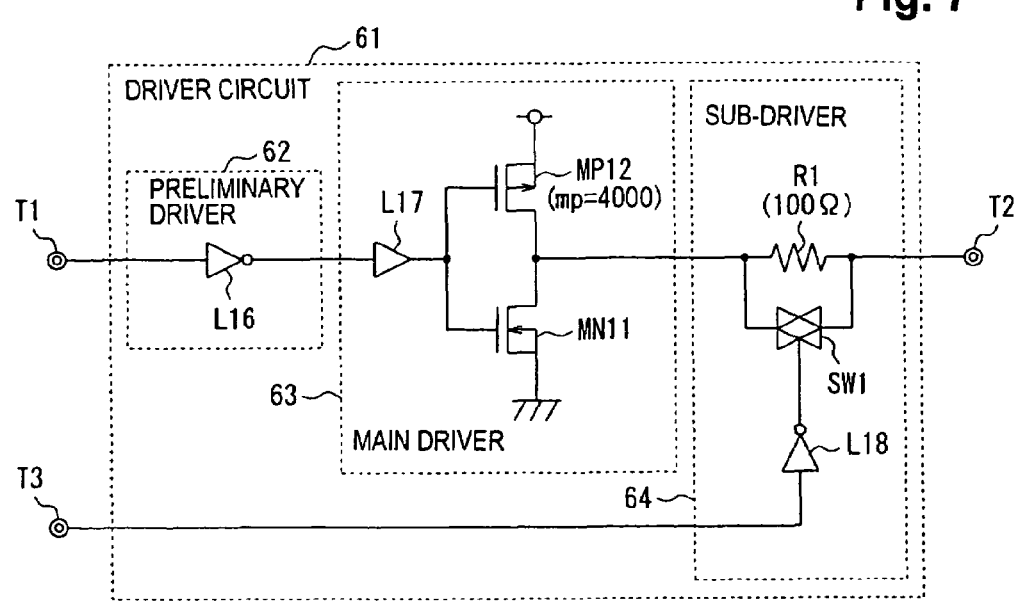
FIG. 7 is a block diagram schematically showing the configuration of the driving system for a switching power supply according to a sixth embodiment of the invention.

FIG. 7 is a block diagram schematically showing the configuration of the driving system for a switching power supply according to a sixth embodiment of the invention.

In FIG. 7, a driver circuit 61 is provided with a preliminary driver 62, a main driver 63 and a sub-driver 64. The driver circuit 61 can be used as the driver circuit 5 shown in FIG. 10.

The preliminary driver 62 is provided with a logic inverting circuit L16. Along with this, the main driver 63 is provided with a buffer L17, a p-channel transistor MP12 and an n-channel transistor MN11. Moreover, the sub-driver 64 is provided with a logic inverting circuit L18, a switch SW1 and a resistor R1.

The p-channel transistor MP12 is made of a plurality of p-channel unit transistors connected in parallel, and the number mp thereof can be taken as, for example, 4000. The value of the resistance of the resistor R1 can be taken as, for example, 100Ω.

The p-channel transistor MP12 and the n-channel transistor MN11 are connected in series. Moreover, the output terminal of the logic inverting circuit L16 is connected to the gates of the p-channel transistor MP12 and the n-channel transistor MN11 through the buffer L17. Furthermore, the input terminal of the logic inverting circuit L16 is connected to a driving signal input terminal T1, and the connection point of the p-channel transistor MP12 and the n-channel transistor MN11 is further connected to a switching device driving terminal T2 through the resistor R1. In addition, the switch SW1 is connected to the resistor R1 in parallel, and a trigger signal input terminal T3 is connected to the turning-on/turning-off signal input terminal of the switch SW1 through the logic inverting circuit L18.

At the start of the resonant operation, a driving signal S1 inputted to the driving signal input terminal T1 of the preliminary driver 62 makes the p-channel transistor MP12 turned-on and, along with this, makes the n-channel transistor MN11 turned-off. Moreover, a trigger signal S3 inputted to the trigger signal input terminal T3 of the sub-driver 64 changes the level of the electric potential at the trigger signal input terminal T3 from a low level to a high level to turn-off the switch R1. Thereby, the resistor R1 is connected to the p-channel transistor MP12 as the load thereof.

Then, the p-channel transistor MP12 which is made turned-on and the n-channel transistor MN10 which is made turned-off along with this with the resistor R1 being connected to the p-channel transistor MP12 as the load thereof make the switching device Q1 shown in FIG. 10 turned-on according to the driving capacity of the p-channel transistor MP10 to start the resonant operation of the switching power supply shown in FIG. 10 while the resistor R1 is being driven by the p-channel transistor MP12.

After the trigger signal S3 is inputted, the change in the level of the electric potential at the trigger signal input terminal T3 from a high level to a low level makes the switch SW1 turned-on to short-circuit the resistor R1, thereby releasing the driver circuit 61 from the state of making the resistor R1 connected to the p-channel transistor MP12 as the load thereof.

Then, at the resonant operation, the driving signal S1 inputted to the driving signal input terminal T1 of the preliminary driver 62 makes the p-channel transistor MP12 turned-on and, along with this, makes the n-channel transistor MN11 turned-off with the resistor R1 being short-circuited. The turning-on of the p-channel transistors MP12 and the turning-off of the n-channel transistor MN11 along with this make the switching device Q1 shown in FIG. 10 turned-on according to the driving capacity of the p-channel transistor MP12 to continue the resonant operation of the switching power supply shown in FIG. 10.

This enables the switching power supply shown in FIG. 10 to make the load of the driver circuit 61 heavier at the start of the resonant operation thereof and to make the load lightened at the resonant operation thereof. Along with this, the connection of the resistor R1 to the p-channel transistor MP12 as the load thereof at the start of the resonant operation can reduce oscillation. Thus, it becomes possible to reduce both of the switching noise N2 at the start of the resonant operation R1 and the switching loss N1 at the resonant operation R2, thereby enabling both of noise reduction at the start of the resonant operation R1 and low power consumption at the resonant operation R2.

Figure 8:
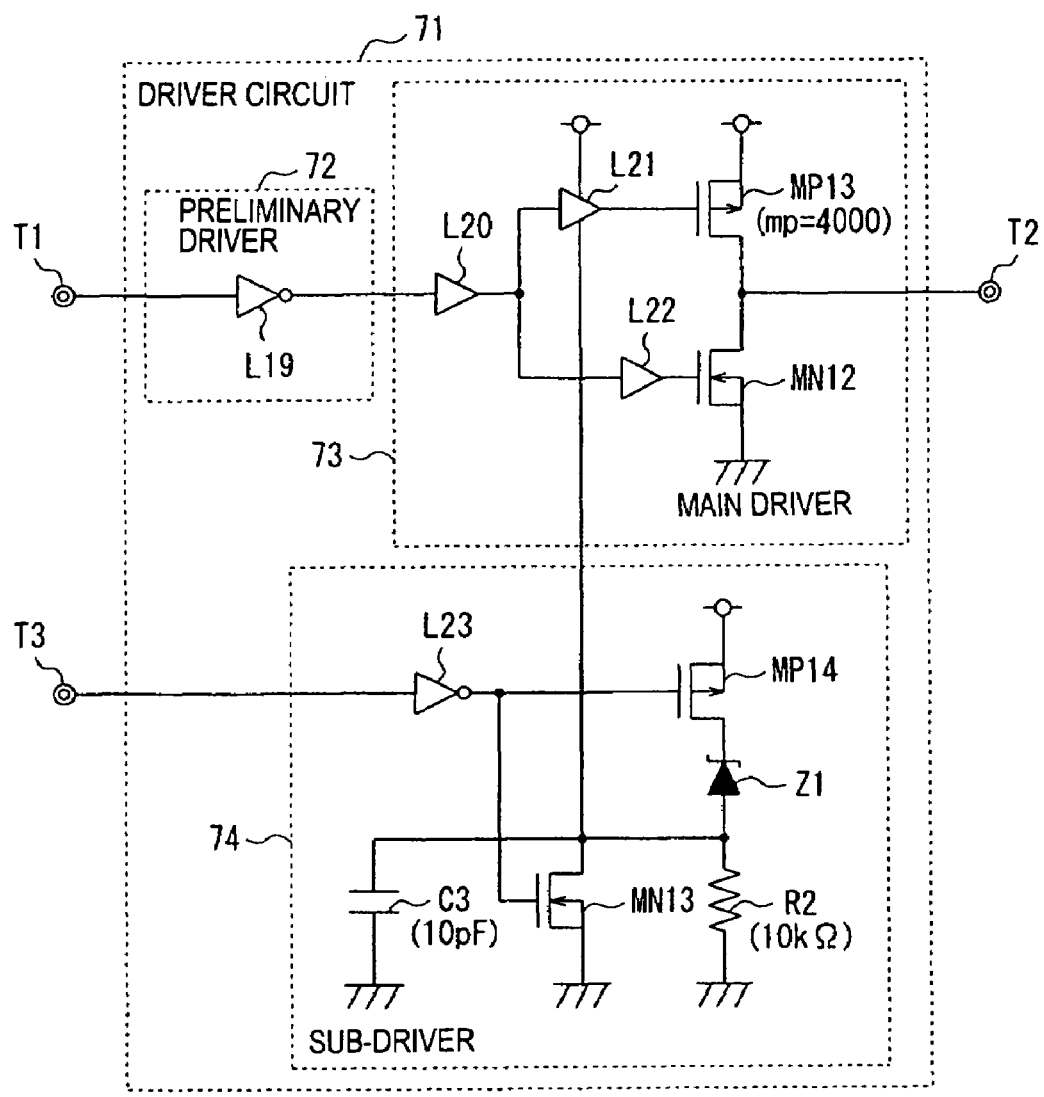
FIG. 8 is a block diagram schematically showing the configuration of the driving system for a switching power supply according to a seventh embodiment of the invention.

FIG. 8 is a block diagram schematically showing the configuration of the driving system for a switching power supply according to a seventh embodiment of the invention.

In FIG. 8, a driver circuit 71 is provided with a preliminary driver 72, a main driver 73 and a sub-driver 74. The driver circuit 71 can be used as the driver circuit 5 shown in FIG. 10.

The preliminary driver 72 is provided with a logic inverting circuit L19. Along with this, the main driver 73 is provided with buffers L20 to L22, a p-channel transistor MP13 and an n-channel transistor MN12. Moreover, the sub-driver 74 is provided with a logic inverting circuit L23, a capacitor C3, a Zener diode Z1, a resistor R2, a p-channel transistor MP14 and an n-channel transistor MN13.

The p-channel transistor MP13 is made of a plurality of p-channel unit transistors connected in parallel, and the number mp thereof can be taken as, for example, 4000. The capacitance of the capacitor C3 can be taken as, for example, 10 pF and the resistance value of the resistor R2 can be taken as, for example, 10 kΩ.

The p-channel transistor MP13 and the n-channel transistor MN12 are connected in series. Along with this, the buffers L21 and L22 are connected to the gates of the p-channel transistor MP13 and the n-channel transistor MN12, respectively. To the buffers L21 and L 22, the output terminal of the logic inverting circuit L19 is further connected through the buffer L20.

Moreover, the input terminal of the logic inverting circuit L19 is connected to a driving signal input terminal T1, and the connection point of the p-channel transistor MP13 and the n-channel transistor MN12 is further connected to a switching device driving terminal T2.

In addition, a trigger signal input terminal T3 is connected to the gates of the p-channel transistor MP14 and the n-channel transistor MN13. The drain of the p-channel transistor MP14 is connected to the resistor R2 through the Zener diode Z1. The drain of the n-channel transistor MN13 is connected to the connection point of the Zener diode Z1 and the resistor R2. Furthermore, one of the power supply terminals of the buffer L21 is connected to the drain of the n-channel transistor MN13, and, along with this, the capacitor C3 is also connected.

At the start of the resonant operation, a driving signal S1 inputted to the driving signal input terminal T1 of the preliminary driver 72 makes the p-channel transistor MP13 turned-on and, along with this, makes the n-channel transistor MN12 turned-off. Moreover, a trigger signal S3 inputted to the trigger signal input terminal T3 of the sub-driver 74 changes the level of the electric potential at the trigger signal input terminal T3 from a low level to a high level to turn-on the p-channel transistor MP14 and, along with this, turn-off the n-channel transistor MN13. Thereby, a current flows in the resistor R2 through the Zener diode Z1 to limit the power supply voltage fed to the buffer L21 by an amount of the voltage drop across the resistor R2.

Then, the p-channel transistor MP13 which is made turned-on and the n-channel transistor MN12 which is made turned-off along with this with the power supply voltage fed to the buffer L21 being limited make the switching device Q1 shown in FIG. 10 turned-on to start the resonant operation of the switching power supply shown in FIG. 10 while the driving capacity of the p-channel transistor MP13 is being limited.

After the trigger signal S3 is inputted, the change in the level of the electric potential at the trigger signal input terminal T3 from a high level to a low level makes the p-channel transistor MP14 turned-off and, along with this, the n-channel transistor MN13 becomes turned-on to release the limitation on the power supply voltage fed to the buffer L21.

Then, at the resonant operation, the driving signal S1 inputted to the driving signal input terminal T1 of the preliminary driver 72 makes the p-channel transistor MP13 turned-on and, along with this, makes the n-channel transistor MN12 turned-off with the limitation on the power supply voltage fed to the buffer L21 being released. The turning-on of the p-channel transistors MP13 and the turning-off of the n-channel transistor MN12 along with this make the switching device Q1 shown in FIG. 10 turned-on according to the driving capacity of the p-channel transistor MP13 to continue the resonant operation of the switching power supply shown in FIG. 10.

This enables the switching power supply shown in FIG. 10 to limit the driving capacity of the p-channel transistor MP13 at the start of the resonant operation thereof and to recover the driving capacity of the p-channel transistor MP13 at the resonant operation thereof. Along with this, the noise in the main driver 73 at the start of the resonant operation can be reduced. Thus, it becomes possible to reduce both of the switching noise N2 at the start of the resonant operation R1 and the switching loss N1 at the resonant operation R2, thereby enabling both of noise reduction at the start of the resonant operation R1 and low power consumption at the resonant operation R2.

Figure 9:
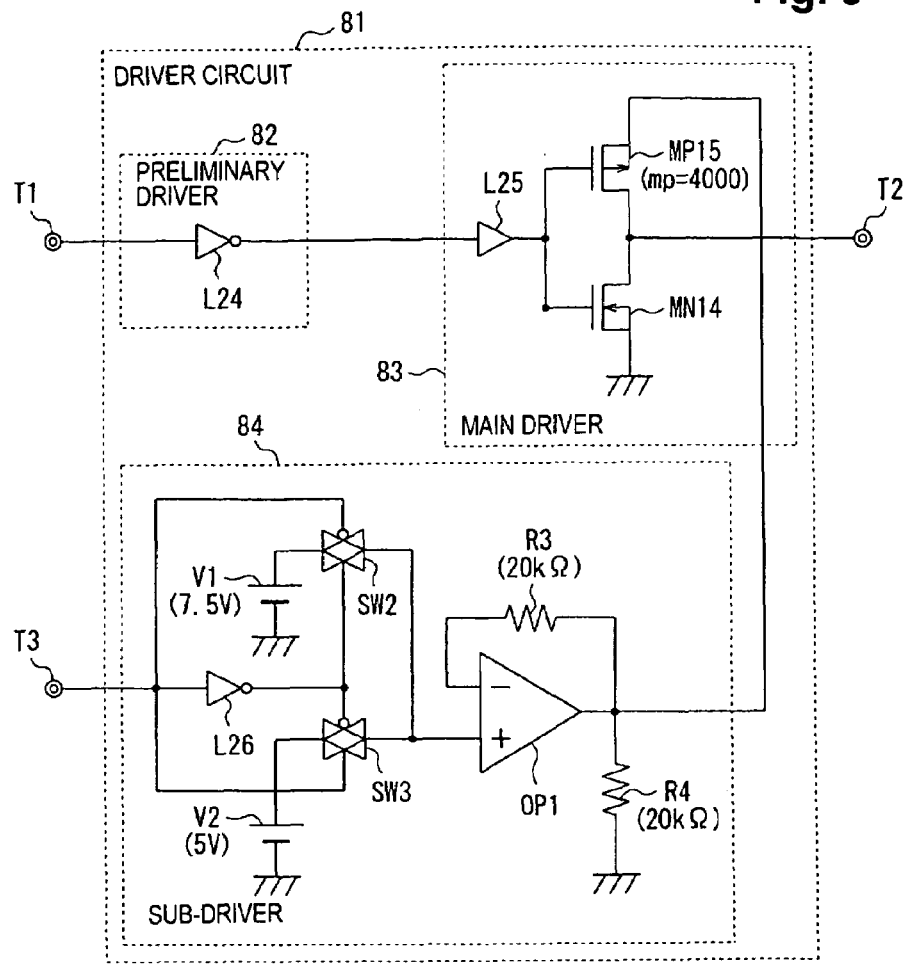
FIG. 9 is a block diagram schematically showing the configuration of the driving system for a switching power supply according to an eighth embodiment of the invention.

FIG. 9 is a block diagram schematically showing the configuration of the driving system for a switching power supply according to an eighth embodiment of the invention.

In FIG. 9, a driver circuit 81 is provided with a preliminary driver 82, a main driver 83 and a sub-driver 84. The driver circuit 81 can be used as the driver circuit 5 shown in FIG. 10.

The preliminary driver 82 is provided with a logic inverting circuit L24. Along with this, the main driver 83 is provided with a buffer L25, a p-channel transistor MP15 and an n-channel transistor MN14. Moreover, the sub-driver 84 is provided with a logic inverting circuit L26, power supplies V1 and V2, resistors R3 and R4, switches SW2 and SW3 and an operational amplifier OP1.

The p-channel transistor MP15 is made of a plurality of p-channel unit transistors connected in parallel, and the number mp thereof can be taken as, for example, 4000. The resistance value of each of the resistors R3 and R4 can be taken as, for example, 20 kΩ. Moreover, the voltage of the power supply V1 can be taken as, for example, 7.5V and the voltage of the power supply V2 can be taken as, for example, 5V.

The p-channel transistor MP15 and the n-channel transistor MN14 are connected in series. Along with this, to the gates of the p-channel transistor MP15 and the n-channel transistor MN14, the output terminal of the logic inverting circuit L24 is connected through the buffer L25.

Moreover, the input terminal of the logic inverting circuit L24 is connected to a driving signal input terminal T1, and the connection point of the p-channel transistor MP15 and the n-channel transistor MN14 is further connected to a switching device driving terminal T2.

The power supplies V1 and V2 are connected to the non-inverting input terminal of the operational amplifier OP1 through the switches SW2 and SW3, respectively. The output terminal of the operational amplifier OP1 is connected to the inverting input terminal of the operational amplifier OP1 through the resistor R3 and, along with this, to the resistor R4 and further to the source of the p-channel transistor MP15. Moreover, a trigger signal input terminal T3 is connected to the off-signal input terminal of the switch SW2 and, along with this, connected to the on-signal input terminal of the switch SW 3. The trigger signal input terminal T3 is further connected to the on-signal input terminal of the on-signal input terminal of the SW2 and, along with this, to the off-signal input terminal of the switch SW3 through the logic inverting circuit L26.

At the start of the resonant operation, a driving signal S1 inputted to the driving signal input terminal T1 of the preliminary driver 82 makes the p-channel transistor MP15 turned-on and, along with this, makes the n-channel transistor MN14 turned-off. Moreover, a trigger signal S3 inputted to the trigger signal input terminal T3 of the sub-driver 84 changes the level of the electric potential at the trigger signal input terminal T3 from a low level to a high level to turn-off the switch SW2 and, along with this, turn-on the switch SW3. Thereby, the voltage from the power supply V2 is inputted to the non-inverting input terminal of the operational amplifier OP1.

The voltage from the power supply V2 inputted to the non-inverting input terminal of the operational amplifier OP1 makes the voltage of the power supply V2 doubled before being applied to the source of the p-channel transistor MP15. Then, the p-channel transistor MP15 which is made turned-on and the n-channel transistor MN14 which is made turned-off along with this with a doubled voltage of the power supply V2 being applied to the source of the p-channel transistor MP15 make the switching device Q1 shown in FIG. 10 turned-on while the driving capacity of the p-channel transistor MP15 is being determined by the voltage from the power supply V2 to start the resonant operation of the switching power supply shown in FIG. 10.

After the trigger signal S3 is inputted, the change in the level of the electric potential at the trigger signal input terminal T3 from a high level to a low level makes the switch SW2 turned-on and, along with this, the switch SW3 turned-off. Thereby, the voltage from the power supply V1 is inputted to the non-inverting input terminal of the operational amplifier OP1.

Then, at the resonant operation, the driving signal S1 inputted to the driving signal input terminal T1 of the preliminary driver 82 makes the p-channel transistor MP15 turned-on and, along with this, makes the n-channel transistor MN14 turned-off with a doubled voltage of the power supply V1 being applied to the source of the p-channel transistor MP15. The turning-on of the p-channel transistors MP15 and the turning-off of the n-channel transistor MN14 make the switching device Q1 shown in FIG. 10 turned-on while the driving capacity of the p-channel transistor MP15 is being determined by the voltage from the power supply V1 to continue the resonant operation of the switching power supply shown in FIG. 10.

This enables the switching power supply shown in FIG. 10 to determine the driving capacity of the p-channel transistor MP15 by a higher voltage at the start of the resonant operation thereof and to determine the driving capacity of the p-channel transistor MP15 by a lower voltage at the resonant operation thereof. This enables the rising of the electric potential at the switching device driving terminal T2 to slow at the start of the resonant operation and also enables the rising of the electric potential at the switching device driving terminal T2 to be abrupt at the resonant operation. Thus, it is possible to reduce both of the switching noise N2 at the start of the resonant operation R1 and the switching loss N1 at the resonant operation R2 thereby enabling both of noise reduction at the start of the resonant operation R1 and low power consumption at the resonant operation R2.

While the present invention has been particularly shown and described with reference to preferred embodiments thereof, it will be understood by those skilled in the art that the foregoing and other changes in form and details can be made therein without departing from the spirit and scope of the present invention.

The disclosure of Japanese Patent Application No. 2007-285015, filed on Nov. 1, 2007 is incorporated in the application.

What is claimed is:

1. A driving system for an electrical power conversion equipment with a switching device, comprising:
   a driving circuit for driving the switching device provided in the electrical power conversion equipment, said driving circuit having a preliminary driver, a main driver and a sub-driver, said main and sub-drivers being connected to the preliminary driver; and
   a driving capacity control circuit connected to the driving circuit for controlling a driving capacity of the driving circuit so that the driving capacity during a resonant operation of the electrical power conversion equipment becomes higher than that at a start of the resonant operation when the switching device is turned-on.

2. The driving system for the electrical power conversion equipment according to claim 1, wherein the main driver drives the switching device at the start of the resonant operation and during the resonant operation; and
   the sub-driver is connected in parallel to the main driver, the driving capacity control circuit operating the sub-driver during the resonant operation and stopping the sub-driver at the start of the resonant operation.

3. The driving system for the electrical power conversion equipment according to claim 1, wherein the driving circuit includes a current mirror circuit for driving the switching device by a current mirror operation.

4. The driving system for the electrical power conversion equipment according to claim 1, wherein the main driver has an output side, for driving the switching device at the start of the resonant operation and during the resonant operation; and
   the sub-driver has a capacitor connected in parallel to the main driver at the output side of the main driver, the driving capacity control circuit disconnecting the capacitor from the output side of the main driver during the resonant operation and connecting the capacitor to the output side of the main driver at the start of the resonant operation.

5. The driving system for the electrical power conversion equipment according to claim 1, wherein the main driver has a control input side, for driving the switching device at the start of the resonant operation and during the resonant operation; and
   the sub-driver has a capacitor connected in parallel to the main driver at the controlling input side thereof, the driving capacity control circuit disconnecting the capacitor from the controlling input side of the main driver at the resonant operation and connecting the capacitor to the controlling input side of the main driver at the start of the resonant operation.

6. The driving system for the electrical power conversion equipment according to claim 1, wherein the main driver has an output side, for driving the switching device at the start of the resonant operation and during the resonant operation; and
   the sub-driver has a resistor connected in series to the output side of the main driver, the driving capacity control circuit short-circuiting the resistor during the resonant operation and releasing the capacitor from being short-circuited at the start of the resonant operation.

7. The driving system for the electrical power conversion equipment according to claim 1, wherein the main driver has a controlling input side, for driving the switching device at the start of the resonant operation and at the resonant operation; and
   the sub-driver switches a voltage of the controlling input side of the main driver, the driving capacity control circuit switching the voltage on the controlling input side of the main driver such that the voltage of the controlling input side of the main driver during the resonant operation of the electrical power conversion equipment becomes higher than that at the start of the resonant operation.

8. The driving system for the electrical power conversion equipment according to claim 1, wherein the main driver has an output side, for driving the switching device at the start of the resonant operation and during the resonant operation, and
   the sub-driver switches a voltage of the output side of the main driver, the driving capacity control circuit switching the voltage of the output side of the main driver such that the voltage during the resonant operation of the electrical power conversion equipment becomes higher than that at the start of the resonant operation.

9. The driving system for the electrical power conversion equipment according to claim 2, wherein the preliminary driver, the main driver and the sub-driver are arranged such that when a driving signal and a trigger signal are inputted to the preliminary driver, the preliminary driver operates the main driver while stopping an operation of the sub-driver, to turn on the switching device to start a resonant operation of the switching power supply, and when a driving signal is inputted to the preliminary driver with the resonant operation of the switching power supply, the preliminary driver operates both the main driver and the sub-driver to turn-on the switching device.

* * * * *

UNITED STATES PATENT AND TRADEMARK OFFICE
CERTIFICATE OF CORRECTION

PATENT NO. : 8,294,506 B2
APPLICATION NO. : 12/289545
DATED : October 23, 2012
INVENTOR(S) : Hidetomo Ohashi It is certified that error appears in the above-identified patent and that said Letters Patent is hereby corrected as shown below:

In the Specifications:

Column 11, line 66, "11 and 12 are connected." should read --I1 and I2 are connected.--

Signed and Sealed this
Eighteenth Day of June, 2013

Teresa Stanek Rea
*Acting Director of the United States Patent and Trademark Office*